United States Patent
Kubo et al.

(10) Patent No.: US 11,554,389 B2
(45) Date of Patent: Jan. 17, 2023

(54) SUBSTRATE CLEANING APPARATUS AND SUBSTRATE CLEANING METHOD

(71) Applicant: Tokyo Electron Limited, Tokyo (JP)

(72) Inventors: Akihiro Kubo, Koshi (JP); Yasushi Takiguchi, Koshi (JP); Teruhiko Kodama, Koshi (JP); Yoshiki Okamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/152,870

(22) Filed: Jan. 20, 2021

(65) Prior Publication Data

US 2021/0220878 A1 Jul. 22, 2021

(30) Foreign Application Priority Data

Jan. 21, 2020 (JP) .............................. JP2020-007677

(51) Int. Cl.
| | |
|---|---|
| *B08B 1/04* | (2006.01) |
| *B08B 11/02* | (2006.01) |
| *B08B 3/04* | (2006.01) |
| *H01L 21/02* | (2006.01) |
| *H01L 21/687* | (2006.01) |
| *H01L 21/67* | (2006.01) |
| *B08B 1/00* | (2006.01) |

(52) U.S. Cl.
CPC .................. *B08B 1/04* (2013.01); *B08B 1/00* (2013.01); *B08B 3/04* (2013.01); *B08B 11/02* (2013.01); *H01L 21/02052* (2013.01); *H01L 21/67046* (2013.01); *H01L 21/68764* (2013.01)

(58) Field of Classification Search
CPC .. B08B 11/02; B08B 1/04; B08B 3/04; B08B 1/00; H01L 21/02052; H01L 21/68764; H01L 21/67046
See application file for complete search history.

(56) References Cited

U.S. PATENT DOCUMENTS

| | | | | |
|---|---|---|---|---|
| 5,910,043 | A * | 6/1999 | Manzonie | B24B 37/26 |
| | | | | 451/529 |
| 7,094,695 | B2 * | 8/2006 | Taylor | B24B 53/017 |
| | | | | 438/692 |
| 9,070,723 | B2 * | 6/2015 | Wang | H01L 21/67051 |
| 9,796,000 | B2 * | 10/2017 | Beck | H01L 21/67051 |
| 9,953,847 | B2 * | 4/2018 | Liu | H01L 21/67057 |
| 9,987,666 | B2 * | 6/2018 | Korbler | B06B 1/0633 |
| 2005/0003737 | A1 * | 1/2005 | Montierth | H01L 21/67057 |
| | | | | 451/5 |
| 2016/0099156 | A1 * | 4/2016 | Yamaguchi | H01L 21/67109 |
| | | | | 438/692 |
| 2018/0071794 | A1 * | 3/2018 | Wang | B06B 3/02 |

FOREIGN PATENT DOCUMENTS

JP 2000-260740 A 9/2000

* cited by examiner

*Primary Examiner* — Benjamin L Osterhout
(74) *Attorney, Agent, or Firm* — Pearne & Gordon LLP

(57) ABSTRACT

A substrate cleaning apparatus configured to clean a surface of a substrate having a circular shape by bringing a cleaning member into contact with the surface of the substrate and rotating the substrate and the cleaning member relatively is provided. A contact region of the cleaning member which comes into contact with the surface of the substrate is widened in a radial shape from a center side of the substrate toward a peripheral side thereof.

9 Claims, 7 Drawing Sheets

SUBSTRATE CLEANING APPARATUS AND SUBSTRATE CLEANING METHOD

CROSS-REFERENCE TO RELATED APPLICATION

This application claims the benefit of Japanese Patent Application No. 2020-007677 filed on Jan. 21, 2020, the entire disclosures of which are incorporated herein by reference.

TECHNICAL FIELD

The various aspects and embodiments described herein pertain generally to a substrate cleaning apparatus and a substrate cleaning method.

BACKGROUND

Patent Document 1 describes a spinner cleaning apparatus equipped with a spinner table capable of spinning at a high speed while holding a wafer; a cleaning water supply device configured to supply cleaning water to the wafer; a first brush member selectively set at an operation position or a non-operation position; and a second brush member selectively set at an operation position or a non-operation position while facing the first brush member. At the operation position of the first brush member, the first brush member is disposed around the spinner table such that a top surface of the first brush member is substantially on a level with a top surface of the spinner table. At the operation position of the second brush member, a surface of the second brush member is in contact with a top surface of the wafer.

Patent Document 1: Japanese Patent Laid-open Publication No. 2000-260740

SUMMARY

In an exemplary embodiment, there is provided a substrate cleaning apparatus configured to clean a surface of a substrate having a circular shape by bringing a cleaning member into contact with the surface of the substrate and rotating the substrate and the cleaning member relatively. A contact region of the cleaning member which comes into contact with the surface of the substrate is widened in a radial shape from a center side of the substrate toward a peripheral side thereof.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
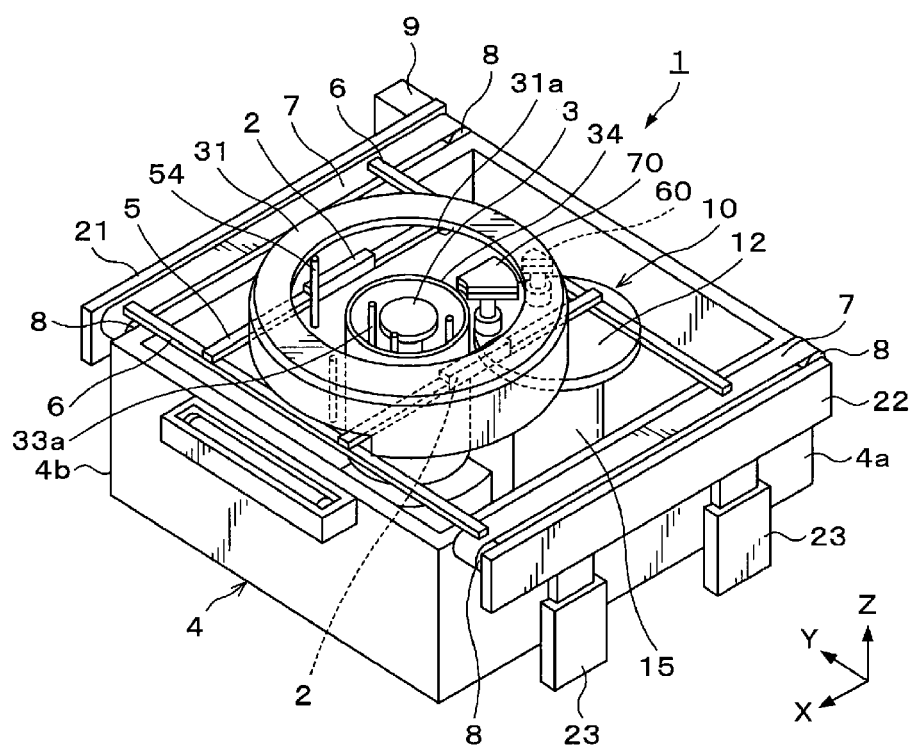
FIG. 1 is a perspective view of a substrate cleaning apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In a manufacturing process for a semiconductor device, to maintain, for example, a semiconductor wafer (hereinafter, simply referred to as "wafer") in a clean state, a process of cleaning the wafer is performed before and/or after individual manufacturing processes and processing processes, when necessary.

In this regard, in the technique disclosed in Patent Document 1, by rotating/scanning a circular brush on a top surface of the wafer as a circular substrate while pressing the circular brush onto the top surface of the wafer, impurities on the top surface of the wafer are removed.

In this method of removing the impurities by rotating/scanning the circular brush on the top surface of the wafer, however, it is found out that there exists non-uniformity in removing efficiency depending on a position on the wafer in a diametrical direction. For the reason of this, it is found out that if this circular brush is rotated/scanned on, for example, a peripheral portion of the wafer, a circumference ratio (a length of a circular arc covered by the circular brush/a circumference length of the wafer) of the circular brush differs between a position close to a center of the wafer and a position outer than that.

In view of the foregoing, the present disclosure aims at providing a technique of improving the circumference ratio of the brush and improving the uniformity in removing efficiency for impurities, particles or the like within a surface of the substrate.

Now, a configuration of a substrate cleaning apparatus according to an exemplary embodiment will be explained with reference to the accompanying drawings. Further, in the specification, parts having same functions and configurations will be assigned same reference numerals, and redundant description will be omitted.

Figure 2:
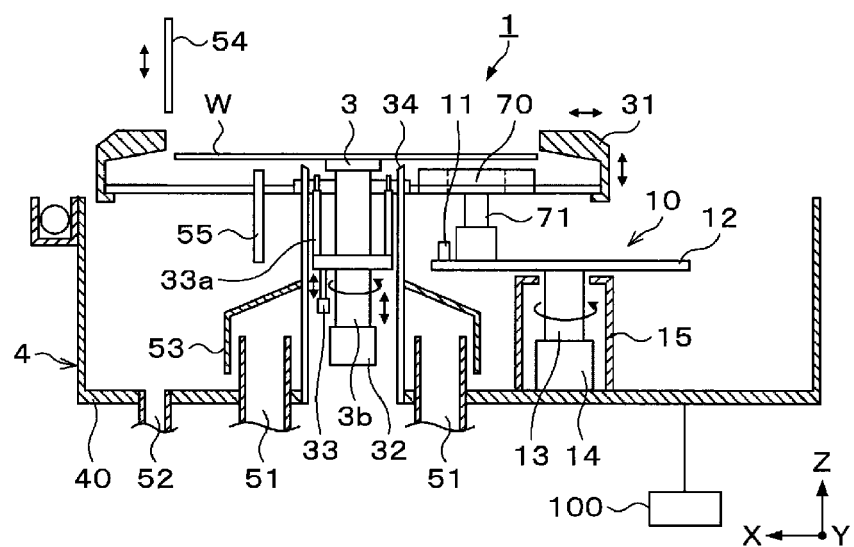
FIG. 2 is a longitudinal cross sectional view of the substrate cleaning apparatus according to the exemplary embodiment.

FIG. 1 is a perspective view of a substrate cleaning apparatus 1, and FIG. 2 is a longitudinal cross sectional view thereof. This substrate cleaning apparatus 1 includes attraction pads 2 configured to attract and hold a wafer W horizontally; a spin chuck 3 configured to receive the wafer W from the attraction pads 2 and attract and hold the wafer W horizontally; and a cleaning device 10 configured to clean a rear surface of the wafer W. The attraction pads 2 serve as a first substrate holder and the spin chuck 3 serves as a second substrate holder. The attraction pads 2, the spin chuck 3 and the cleaning device 10 are accommodated in a lower cup 4 having a box shape with an open top.

The lower cup 4 has a rectangular shape when viewed from the top, and has mutually facing sidewalls. Among these, a direction in which two facing sidewalls 4a and 4b at a front side and an opposing inner side in FIG. 1 are extended is defined as an X direction.

The attraction pads 2 are configured to be movable in a horizontal direction while attracting and holding horizontally a region of the rear surface of the wafer W which is not overlapped with a central portion thereof. Each attraction pad 2 is implemented by, for example, a long and narrow block. These attraction pads 2 are arranged to support and hold the region of the rear surface near a periphery thereof in parallel. Each attraction pad 2 is connected to a non-illustrated suction device, and has a function as a vacuum chuck configured to attract and hold the wafer W through a suction hole (not shown) in a top surface thereof. Further, each attraction pad 2 is mounted to a central portion of a narrow and long rod-shaped pad support 5, and both ends of each of the two pad supports 5 are respectively mounted to two beam members 6.

Both ends of each of the two beam members 6 are fixed to a corresponding one of two belts 7 respectively provided at an outside of the two facing sidewalls 4a and 4b of the lower cup 4 along these sidewalls 4a and 4b. Each belt 7 is wound around a pair of two rollers 8. The belts 7 are moved in the X direction by being driven by a driving device 9, so that the beams members 6 are also moved in the X direction, thus allowing the pad supports 5 supported by the beam members 6 to be moved in the X direction as well.

Further, the rollers 8 at one side and the driving device 9 are supported by a side plate 21, and the rollers 8 at the other side are supported by a side plate 22. These side plates 21 and 22 are movable up and down by an elevating device 23. That is, the belts 7 are movable in a Z direction through an operation of the elevating device 23, thus allowing the pad supports 5 to be moved in the Z direction.

Further, a ring-shaped upper cup 31 is placed on the pad supports 5 and the beam members 6 to suppress scattering of a cleaning liquid. The upper cup 31 is moved in the X direction and the Z direction along with the pad supports 5 and the beam members 6.

An opening 31a having a diameter larger than a diameter of the wafer W is formed in a top surface of the upper cup 31. Through this opening 31a, the wafer W can be delivered between a transfer device of a coating and developing apparatus and the attraction pads 2 or the spin chuck 3.

Now, the spin chuck 3 will be described. The spin chuck 3 is configured to attract and hold the central portion of the rear surface of the wafer W and be pivotable around a vertical axis. The spin chuck 3 is formed to have a circular plate shape and located at a midway position between the two attraction pads 2 which are arranged substantially in parallel to each other. Here, regions of the rear surface of the wafer W respectively held by individual substrate holders (the attraction pads 2 and the spin chuck 3) are not overlapped. As depicted in FIG. 2, the spin chuck 3 is connected to a driving device 32 via a rotation/elevation shaft 3b, and the spin chuck 3 is configured to be pivotable and movable up and down by this driving device 32. Further, like the attraction pads 2, the spin chuck 3 is also connected to a non-illustrated suction pipe and serves as a vacuum chuck which attracts and holds the wafer W through a suction hole (not shown) formed in a top surface thereof.

Supporting pins 33a connected with an elevating device 33 are provided around the spin chuck 3. The supporting pins 33a are configured to be moved up and down while supporting the rear surface of the wafer W. The supporting pins 33a are configured to deliver the wafer W from an external transfer device onto the attraction pads 2 or from the spin chuck 3 to the external transfer device in cooperation with the external transfer device.

Furthermore, an air knife 34 is disposed to surround the spin chuck 3 and the supporting pins 33a. The air knife 34 is implemented by, for example, a cylindrical surrounding member. Jetting holes (not shown) for a gas are formed on a top end of the air knife in a circumferential direction thereof, and the air knife 34 is configured to jet the gas such as compressed air toward the rear surface of the wafer W through these jetting holes. By way of example, the air knife 34 is formed of double cylinders, and is configured to be capable of supplying the gas supplied from a non-illustrated supply to the jetting holes through a hollow space between the double cylinders. The air knife 34 serves to blow the cleaning liquid on the rear surface of the wafer W outwards and dry the rear surface of the wafer W when the wafer W is delivered onto the spin chuck 3, thus allowing a surface of the spin chuck 3 and the rear surface of the wafer W held by this spin chuck 3 to come into contact with each other in a dry state.

Exhaust lines 51 for exhausting an air current within the substrate cleaning apparatus 1 and a drain line 52 for draining the cleaning liquid collected within the lower cup 4 are provided at a bottom 40 of the lower cup 4. Further, to suppress a droplet of the cleaning liquid from entering the exhaust lines 51 directly, openings of the exhaust lines 51 are covered with an inner cup 53 which is a ring-shaped cover attached to a side portion of the air knife 34.

A blow nozzle 54 is provided above the upper cup 31. The blow nozzle 54 is configured to facilitate, after an end of the cleaning of the wafer W, drying of the remaining cleaning liquid by jetting compressed air or the like to a region of the wafer W near an edge thereof from above it. Further, a cleaning liquid nozzle 55 is provided at an outside of the air knife 34 to supply the cleaning liquid to the rear surface of the wafer W in cooperation with cleaning liquid nozzles 11 provided in the cleaning device 10 to be described later.

Here, a height position of the wafer W will be explained. As will be described later, the wafer W is delivered onto the attraction pads 2 from the external transfer device. While being held by the attraction pads 2, the wafer W is moved to the right in the X direction shown in FIG. 2, and cleaning of the central portion of the rear surface of the wafer W is performed. At a cleaning position shown in FIG. 2, the rear surface of the wafer W is located higher than a leading end of the air knife 34, and the rear surface of the wafer W does not interfere with the air knife 34 when the wafer W is moved in the X direction in the state that it is held by the attraction pads 2.

Figure 3:
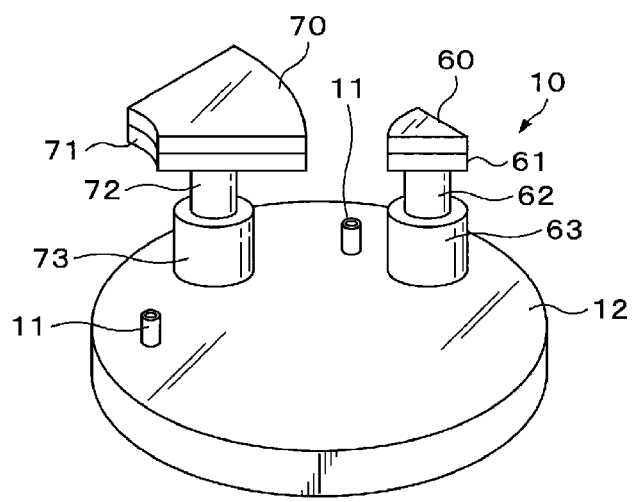
FIG. 3 is a perspective view of a cleaning device in the substrate cleaning apparatus according to the exemplary embodiment.

Now, the cleaning device 10 configured to clean the rear surface of the wafer W will be discussed. The cleaning device 10 includes a rotary base 12 formed of, for example, a circular plate, as shown in FIG. 3. The rotary base 12 is disposed to face the wafer W held on the attraction pads 2 or the spin chuck 3. A central cleaning member 60 and a peripheral cleaning member 70 are provided on a top surface of the rotary base 12, as illustrated in FIG. 3. Further, the aforementioned cleaning liquid nozzles 11 are also provided on the top surface of the rotary base 12.

The rotary base 12 is configured to be pivotable around a vertical axis by a driving device 14 via a rotation shaft 13 provided at a rear surface side thereof. By way of example, the rotation shaft 13 is provided at a center of the rotary base 12. Accordingly, when viewed from the top, the center of the rotary base 12 and a center of the rotation shaft 13 are coincident, and this center serves as a rotation center. In this example, the rotary base 12, the rotation shaft 13 and the driving device 14 constitute a rotation device.

As depicted in FIG. 3, the central cleaning member 60 has a supporting member 61 at a lower surface side thereof, and the supporting member 61 is supported by a supporting body 62. The supporting body 62 is configured to be movable up and down and pivotable by a driving device 63. The central cleaning member 60 is made of, by way of example, but not limitation, PVA.

Figure 4:
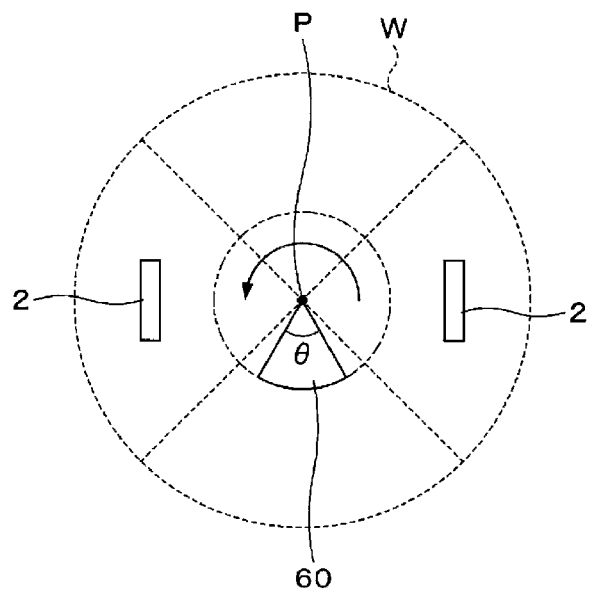
FIG. 4 is a plan view illustrating a relationship between a central cleaning member and a wafer in the substrate cleaning apparatus according to the exemplary embodiment.

A wafer contact region of the central cleaning member 60 is of a sector shape (so-called circular triangle), as illustrated in FIG. 4. To elaborate, when viewed from the top, an apex of the central cleaning member 60 having the sector shape is located at a center P of the wafer W attracted to and held by the attraction pads 2 when the cleaning is performed. Here, a central angle θ of the sector shape is set to be 54 degrees. This setting is based on the following grounds.

That is, in case of cleaning a wafer by rotating a conventional circular brush around a center of the wafer, there exists the non-uniformity in removing efficiency within the surface of the wafer as mentioned above. The reason for this is investigated, and it is found out that it is because a circumference ratio of the circular brush differs depending on a position on the circular brush. That is, the circumference ratio is the highest on a rotation trajectory passing through a center of the circular brush, and decreases as it goes toward an edge of the brush to become the lowest near the edge of the brush. Through an actual experiment, it is found out that removing efficiency for impurities is high in a region of the brush where the circumference ratio is equal to or larger than 15%. Thus, if the circumference ratio equal to or larger than 15% can be obtained in the entire region of the brush, the removing efficiency within the surface of the wafer can be improved.

In view of the foregoing, to obtain a circumference ratio of 15% in the entire wafer contact region of the central cleaning member 60, the central angle θ of the sector shape needs to be set to be 360 degrees×15%=54 degrees. From this point of view, the central angle θ of the sector-shaped central cleaning member 60 according to the present exemplary embodiment is set to be, e.g., 54 degrees. To obtain the circumference ratio higher than 15%, the central angle θ needs to be set to be higher than 54 degrees.

Meanwhile, a bottom surface of the peripheral cleaning member 70 is supported by a supporting member 71, as illustrated in FIG. 3, and this supporting member 71 is supported by a supporting body 72. The supporting body 72 is movable up and down by a driving device 73. The peripheral cleaning member 70 is made of, by way of non-limiting example, PVA.

Figure 5:
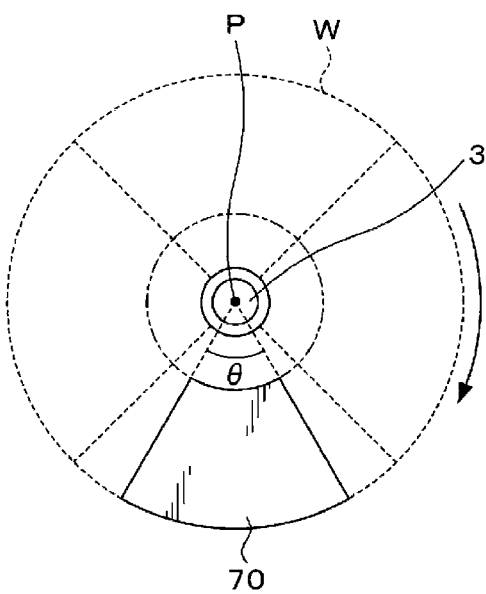
FIG. 5 is a plan view illustrating a relationship between a peripheral cleaning member and the wafer in the substrate cleaning apparatus according to the exemplary embodiment.

A wafer contact region of the peripheral cleaning member 70 which comes into contact with the wafer is of a sector shape, as illustrated in FIG. 5. This sector shape is a shape surrounded by two radius of a circle and an arc therebetween, as shown in this figure. When a periphery of the wafer W is cleaned, the wafer W is attracted to and held by the spin chuck 3, and the peripheral cleaning member 70 is placed such that a center of the central angle θ at the moment coincides with the center P of the wafer W. The central angle θ is set to be 54 degrees to obtain the aforementioned circumference ratio of 15%.

The above-described substrate cleaning apparatus 1 is equipped with a controller 100, as shown in FIG. 2. The controller 100 is implemented by, for example, a computer and includes a program storage (not shown). A program for controlling a cleaning processing upon the wafer W to be described later in the substrate cleaning apparatus 1, or the like is stored in the program storage. Further, the program storage also stores therein a program for controlling, for example, operations of various processing apparatuses and a driving system such as transfer devices in a substrate processing system in which the substrate cleaning apparatus 1 is installed. Further, the programs may be recorded in a computer-readable recording medium and installed from this recording medium to the controller 100.

The substrate cleaning apparatus 1 according to the exemplary embodiment has the above-described configuration, and, now, cleaning of the rear surface of the wafer W performed by using this substrate cleaning apparatus 1 will be explained. As stated above, the substrate cleaning apparatus 1 includes the central cleaning member 60 configured to be brought into contact with the central portion of the rear surface of the wafer W and clean the corresponding central portion; and the peripheral cleaning member 70 configured to be brought into contact with the peripheral portion of the rear surface of the wafer W and clean this peripheral portion. The substrate cleaning apparatus 1 is configured to clean the entire rear surface of the wafer W with these two cleaning members. Typically, the central portion of the rear surface of the wafer W is first cleaned, and, the peripheral portion of the rear surface of the wafer W is then cleaned.

Figure 6:
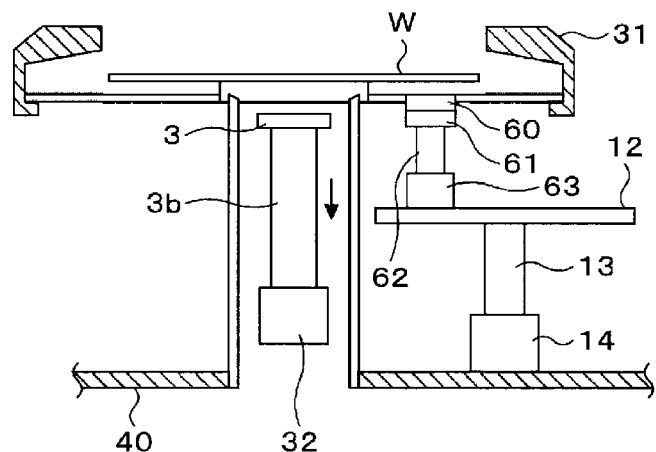
FIG. 6 is a longitudinal cross sectional view illustrating an operation of the substrate cleaning apparatus when a central portion of the wafer is cleaned by the central cleaning member according to the exemplary embodiment.
Figure 7:
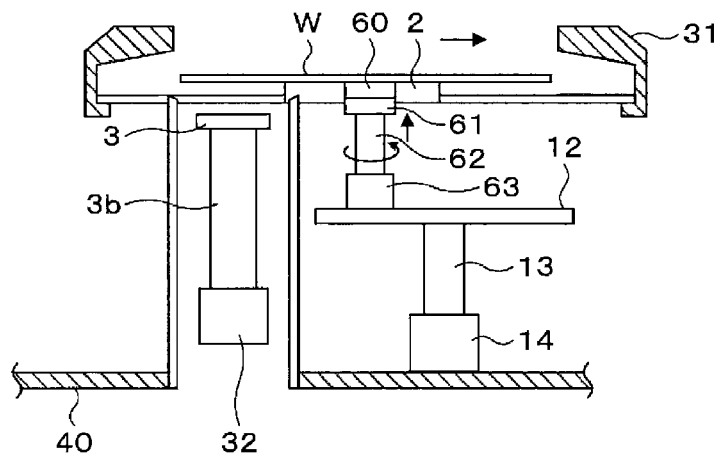
FIG. 7 is a longitudinal cross sectional view illustrating a state in which the central portion of the wafer is cleaned by the central cleaning member in the substrate cleaning apparatus according to the exemplary embodiment.

That is, as shown in FIG. 6, the spin chuck 3 is lowered in the state that the wafer W is attracted to and held by the attraction pads 2. Then, by moving the belts 7, the wafer W is moved in the X direction to a central cleaning position, as shown in FIG. 7. Concurrently, the rotary base 12 is rotated, and the central cleaning member 60 is moved to a preset position shown in FIG. 4, for example. Then, by operating the driving device 63, the central cleaning member 60 is moved upwards until it comes into contact with the rear surface of the wafer W. Concurrently, while supplying the cleaning liquid onto the rear surface of the wafer W from the cleaning liquid nozzle 11, the central cleaning member 60 is rotated. At this time, a rotation center of the central cleaning member 60 coincides with the center P of the wafer W, as illustrated in in FIG. 4.

Accordingly, a central region inside a dashed double-dotted line in FIG. 4 is cleaned by the central cleaning member 60, so that impurities, particles or the like adhering to the rear surface of the wafer W are removed. Here, since the central cleaning member 60 has the sector shape and has the circumference ratio of 15%, the removing of the impurities, the particles, or the like can be carried out uniformly in the entire central region inside the dashed double-dotted line.

Figure 8:
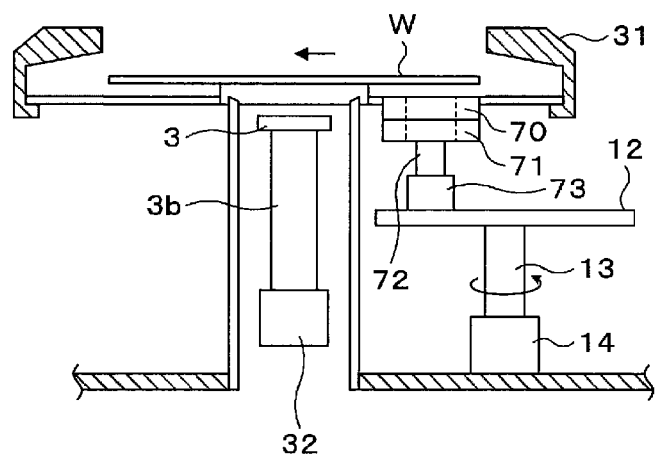
FIG. 8 is a longitudinal cross sectional view illustrating an operation of the substrate cleaning apparatus when a peripheral portion of the wafer is cleaned by the peripheral cleaning member according to the exemplary embodiment.

Upon the completion of the cleaning of the central region of the rear surface of the wafer W as stated above, the central cleaning member 60 is lowered. Then, by driving the belts 7, the wafer W is moved in a direction indicated by an arrow in FIG. 8 to a peripheral cleaning position. The peripheral cleaning position of the wafer W refers to a position where the center P of the wafer W is attracted to and held by a center of the spin chuck 3. Concurrently, by rotating the rotary base 12, the peripheral cleaning member 70 is moved to a preset peripheral cleaning position.

Figure 9:
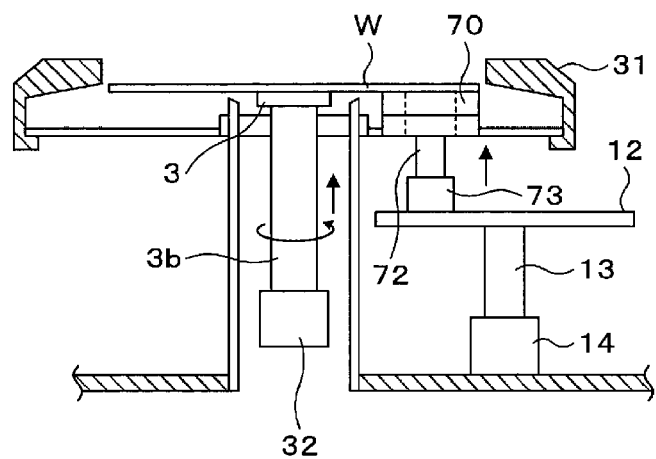
FIG. 9 is a longitudinal cross sectional view illustrating a state in which the peripheral portion of the wafer is cleaned by the peripheral cleaning member in the substrate cleaning apparatus according to the exemplary embodiment.

After the wafer W is moved to the peripheral cleaning position, the spin chuck 3 is raised to attract and hold the wafer W, as illustrated in FIG. 9, and the wafer W is rotated at a preset speed. Then, the peripheral cleaning member 70 is raised to come into contact with and press a peripheral position on the rear surface of the wafer W. Accordingly, a peripheral region outside a dashed double-dotted line in FIG. 5 is cleaned by the peripheral cleaning member 70, so that impurities, particles, or the like adhering to the rear surface of the wafer W are removed. Here, since the peripheral cleaning member 70 has the sector shape and the circumference ratio thereof is 15%, the removing of the impurities and the particles can be carried out uniformly in the entire peripheral region outside the dashed double-dotted line.

Figure 10:
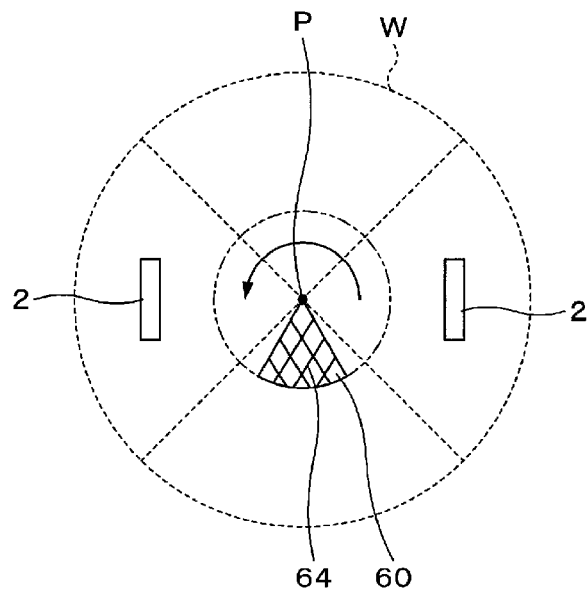
FIG. 10 is a plan view of a central cleaning member having grooves.

The central cleaning member 60 may be provided with grooves 64, as illustrated in FIG. 10. In this example, the multiple grooves 64 are formed in parallel to intersect with each other diagonally. Accordingly, a contact surface of the central cleaning member 60 which comes into contact with the wafer W can be divided, and each divided contact surface can be pressed onto the wafer W uniformly. Thus, in overall, more uniform removing can be carried out. Further, since the cleaning liquid enters the grooves 64 easily, the cleaning liquid is allowed to reach up to a central portion of the central cleaning member 60. As a result, a cleaning effect of the cleaning liquid can be uniformly achieved in the entire contact region of the central cleaning member 60.

Figure 11:
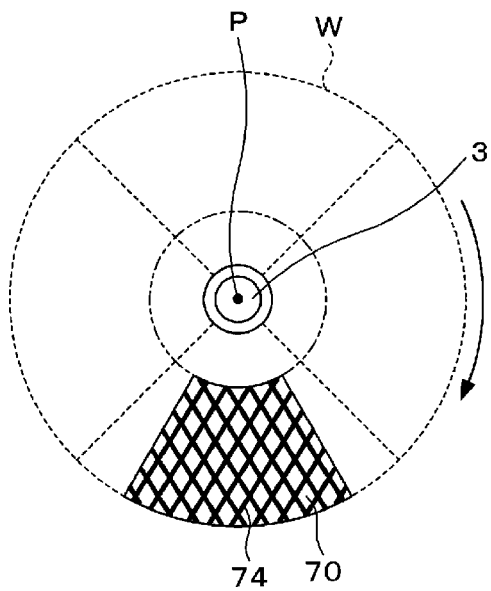
FIG. 11 is a plan view of a peripheral cleaning member having grooves.

From the same perspective, grooves 74 which are the same as the grooves 64 may be formed on the peripheral cleaning member 70, as illustrated in FIG. 11. Accordingly, a contact surface of the peripheral cleaning member 70 which comes into contact with the wafer W is subdivided. Thus, in overall, the entire peripheral cleaning member 70 can be uniformly pressed onto the wafer W, so that more uniform removing can be carried out in overall. Furthermore, since the cleaning liquid easily enters the grooves 74, the cleaning liquid is allowed to reach up to a central portion of the peripheral cleaning member 70. As a result, the cleaning effect of the cleaning liquid can be uniformly achieved in the entire contact region of the peripheral cleaning member 70.

Moreover, the groove 74 of the peripheral cleaning member 70 shown in FIG. 11 is set to be larger than the groove 64 of the aforementioned central cleaning member 60. It is because the contact region of the peripheral cleaning member 70 which comes into contact with the cleaning target is larger than that of the central cleaning member 60, and the cleaning liquid needs to be further allowed to reach the entire peripheral cleaning member 70. Instead of enlarging the width of the groove 74, the number of the grooves 74 formed at the peripheral cleaning member 70 may be increased.

If, however, the grooves 64 and 74 are formed on the central cleaning member 60 and the peripheral cleaning member 70, respectively, an actual contact area between the central cleaning member 60 and the rear surface of the wafer W and an actual contact area between the peripheral cleaning member 70 and the rear surface of the wafer W are reduced, and, accordingly, the aforementioned circumference ratio of 15% may not be acquired. In such a case, by increasing the central angle θ of the sector-shaped central cleaning member 60 and peripheral cleaning member 70 from 54 degrees, the circumference ratio of 15% can be still obtained.

Figure 12:
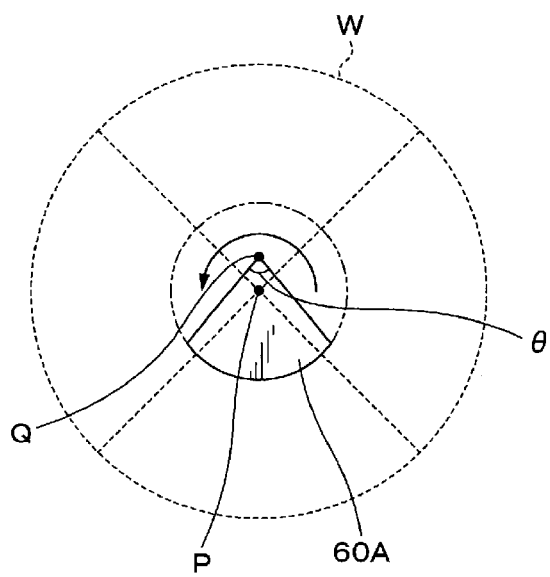
FIG. 12 is a plan view of a central cleaning member in which a center of a sector shape is deviated from a center of the wafer.

Furthermore, in the aforementioned example, though both the central cleaning member 60 and the peripheral cleaning member 70 are designed such that the center of their sector shape coincides with the center P of the wafer W, the exemplary embodiment is not limited thereto. By way of example, as illustrated in FIG. 12, the central cleaning member 60 may be replaced by a central cleaning member 60A which is designed such that the center P of the wafer W is included in a contact region of the central cleaning member 60A and a center Q of a sector shape of the central cleaning member 60A is deviated from the center P of the wafer W. With this configuration, impurities in the vicinity of the center P of the wafer W can also be securely removed. In such a case, a central angle θ may be set to be larger than 54 degrees, or may be set to be smaller than 54 degrees within a range where a required preset circumference ratio, that is, a circumference ratio equal to or larger than 15% is obtained.

Figure 13:
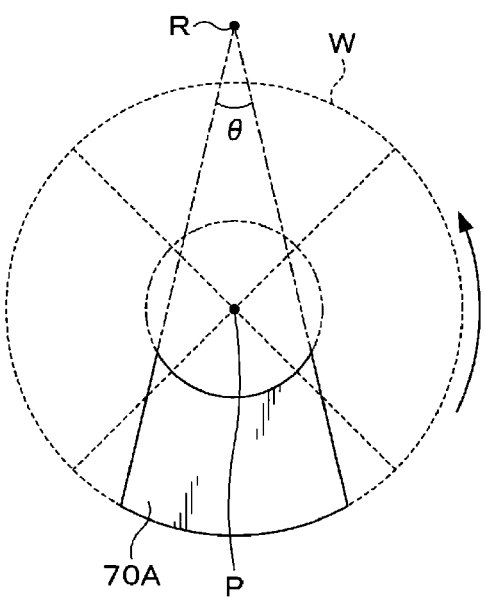
FIG. 13 is a plan view of a peripheral cleaning member in which a center of a sector shape is located at an outside of the wafer.

Additionally, the peripheral cleaning member 70 may also be designed such that a center R of the sector shape thereof is deviated from the center P of the wafer W, for example, such that the center R is located at an outside of the wafer W, as depicted in FIG. 13. This configuration is effective when it is required to improve removing efficiency for the central portion of the wafer W while obtaining the circumference ratio of 15%. In this case, to minimize the peripheral cleaning member 70 while maintaining sufficient removing efficiency for the impurities or the like, the central angle θ of the sector shape may be set to be smaller than 54 degrees within a range where the circumference ratio equal to or higher than 15% is obtained.

In view of the foregoing, if the wafer contact region of each of the central cleaning member 60 and the peripheral cleaning member 70 is enlarged in a radial shape from a center side of the wafer W toward a peripheral side thereof, the circumference ratio can be improved in the entire wafer contact region, as compared to a conventional circular cleaning brush, so that the removing efficiency for the impurities or the like within the surface of the wafer W can be uniformed. Further, both the central cleaning member 60 and the peripheral cleaning member 70 may not be formed to have such a shape. If at least one of them is formed to have the shape enlarged in the radial shape from the center side of the wafer W toward the peripheral side thereof, uniformity in the removing efficiency within the surface of the wafer W can still be improved if it is used in combination with the conventional circular brush.

Moreover, though the above exemplary embodiment has been described for the example where the rear surface of the wafer W is cleaned, the technique of the present disclosure is also applicable to a case of cleaning a front surface of the wafer W after, for example, a CMP processing or the like.

The central cleaning member 60, the central cleaning member 60 having the grooves 64 and the central cleaning member 60A, and the peripheral cleaning member 70, the peripheral cleaning member 70 having the grooves 74 and the peripheral cleaning member 70A may be used in any of various combinations. When they are combined, though it is desirable that a length of an outer circular arc portion of the central cleaning member 60, the central cleaning member 60 having the grooves 64 or the central cleaning member 60A is set to be equal to a length of an inner circular arc portion of the peripheral cleaning member 70, the peripheral cleaning member 70 having the grooves 74, or the peripheral cleaning member 70A, the outer circular arc portion of the central cleaning member 60, the central cleaning member 60 having the grooves 64 or the central cleaning member 60A may have a size and a shape protruding toward the contact region of the peripheral cleaning member 70, the peripheral cleaning member 70 having the grooves 74 or the peripheral cleaning member 70A.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

By way of example, the aforementioned rotary base 12 may be replaced by an arm-shaped base or a slidable base. That is, the base may have any of various configurations as long as it is capable of moving the central cleaning member 60 and the peripheral cleaning member 70 to the preset central cleaning position and the peripheral cleaning position, respectively.

According to the exemplary embodiment, it is possible to improve uniformity in removing efficiency for impurities, particles or the like within the surface of the substrate.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate cleaning apparatus configured to clean a surface of a substrate having a circular shape by bringing a cleaning member into contact with the surface of the substrate and rotating the substrate and the cleaning member relatively, the substrate cleaning apparatus comprising:
    a driving device configured to move the cleaning member to be brought into contact with the surface of the substrate; and
    a spin chuck configured to rotate the substrate,
    wherein an entire area of a top surface of the cleaning member comes into contact with the surface of the substrate, and
    wherein a contact region between the cleaning member and the surface of the substrate has a shape that is widened radially from a center side of the substrate toward a peripheral side thereof.

2. The substrate cleaning apparatus of claim 1, wherein the contact region of the cleaning member is of a sector shape when viewed from a top.

3. The substrate cleaning apparatus of claim 1, wherein the cleaning member comprises a central cleaning member configured to be brought into contact with a central portion of the substrate and a peripheral cleaning member configured to be brought into contact with a peripheral portion of the substrate.

4. The substrate cleaning apparatus of claim 1, wherein a groove is formed on the contact region of the cleaning member.

5. The substrate cleaning apparatus of claim 1,
    wherein the cleaning member comprises a central cleaning member configured to be brought into contact with a central portion of the substrate and a peripheral cleaning member configured to be brought into contact with a peripheral portion of the substrate,
    a groove is formed on a contact region of each of the central cleaning member and the peripheral cleaning member which comes into contact with the substrate, and
    the groove of the peripheral cleaning member is larger than the groove of the central cleaning member.

6. The substrate cleaning apparatus of claim 1, wherein the cleaning member has a circular sector shape and a central angle θ of the cleaning member is equal to or higher than 54 degrees.

7. A substrate cleaning method of cleaning a surface of a substrate having a circular shape by bringing a cleaning member into contact with the surface of the substrate and rotating the substrate and the cleaning member relatively, the substrate cleaning apparatus comprising:
    a driving device configured to move the cleaning member to be brought into contact with the surface of the substrate; and
    a spin chuck configured to rotate the substrate,
    wherein an entire area of a top surface of the cleaning member comes into contact with the surface of the substrate, and
    wherein the cleaning member comprises a central cleaning member configured to be brought into contact with a central portion of the substrate and a peripheral cleaning member configured to be brought into contact with a peripheral portion of the substrate,
    a contact region of each of the central cleaning member and the peripheral cleaning member has a shape widened radially from a central side of the substrate toward a peripheral side thereof,
    the substrate cleaning method comprises:
    rotating the cleaning member and the substrate relatively while bringing the cleaning member configured to be brought into contact with the surface of the substrate into contact with a cleaning target surface of the substrate;
    cleaning the central portion of the substrate by the central cleaning member; and
    cleaning the peripheral portion of the substrate by the peripheral cleaning member.

8. The substrate cleaning method of claim 7,
wherein the contact region of the central cleaning member is of a sector shape when viewed from a top, and a center of the sector shape is deviated from a center of the substrate.

9. The substrate cleaning method of claim 7,
wherein the contact region of the peripheral cleaning member is of a sector shape when viewed from a top, and a center of the sector shape is deviated from a center of the substrate.

* * * * *